(12) United States Patent
Petrov

(10) Patent No.: US 11,342,725 B2
(45) Date of Patent: May 24, 2022

(54) LIGHT EMISSION APPARATUS

(71) Applicant: Artilux, Inc., Menlo Park, CA (US)

(72) Inventor: Konstantin P. Petrov, Hsinchu County (TW)

(73) Assignee: ARTILUX, INC., Menlo Park, CA (US)

( * ) Notice: Subject to any disclaimer, the term of this patent is extended or adjusted under 35 U.S.C. 154(b) by 51 days.

(21) Appl. No.: 17/071,970

(22) Filed: Oct. 15, 2020

(65) Prior Publication Data

US 2021/0119415 A1 Apr. 22, 2021

Related U.S. Application Data

(60) Provisional application No. 62/916,243, filed on Oct. 17, 2019.

(51) Int. Cl.
*H01S 5/0683* (2006.01)
*G01S 7/4911* (2020.01)
*G01S 7/484* (2006.01)

(52) U.S. Cl.
CPC .......... *H01S 5/06835* (2013.01); *G01S 7/484* (2013.01); *G01S 7/4911* (2013.01)

(58) Field of Classification Search
CPC .................................................. H01S 5/06835
USPC ....................................................... 372/29.01
See application file for complete search history.

(56) References Cited

U.S. PATENT DOCUMENTS

2009/0129415 A1* 5/2009 Li ........................ H01S 5/06804
372/38.01
2018/0261975 A1* 9/2018 Pavlov .................. G01S 7/4816

* cited by examiner

*Primary Examiner* — Tuan N Nguyen
(74) *Attorney, Agent, or Firm* — Dority & Manning, P.A.

(57) ABSTRACT

A light emission apparatus includes a transistor comprising a control terminal, a first channel terminal, and a second channel terminal, wherein the control terminal is configured to receive a modulation signal, the first channel terminal is configured to generate a driving signal according to the modulation signal, and the second channel terminal is coupled to a fixed voltage; and a load comprising: a first terminal; a second terminal, wherein the first terminal is coupled to the first channel terminal of the transistor and the second terminal is coupled to the fixed voltage; a laser diode configured to emit a light according to the driving signal; and a first capacitor coupled to the laser diode, configured to isolate a DC current on the first terminal of the transistor.

18 Claims, 7 Drawing Sheets

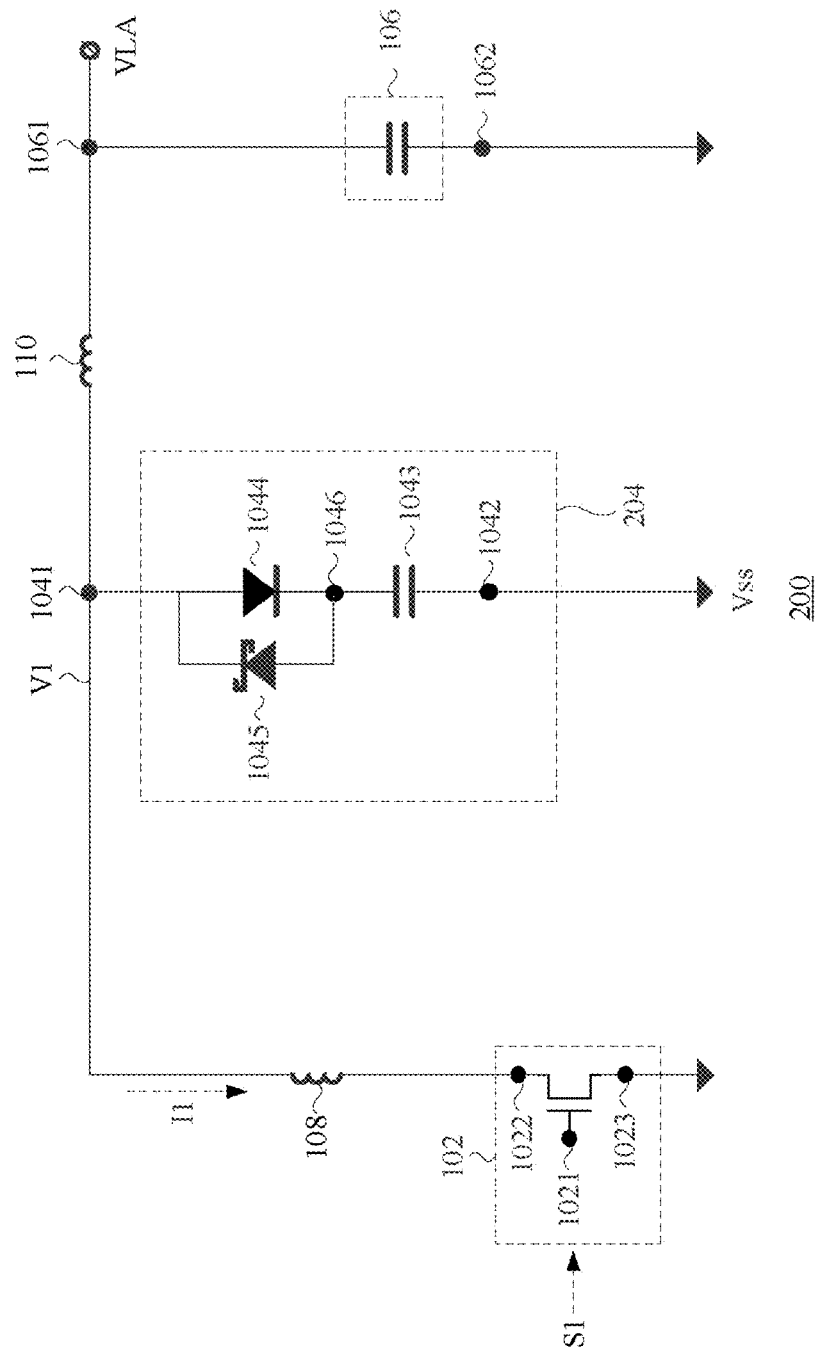

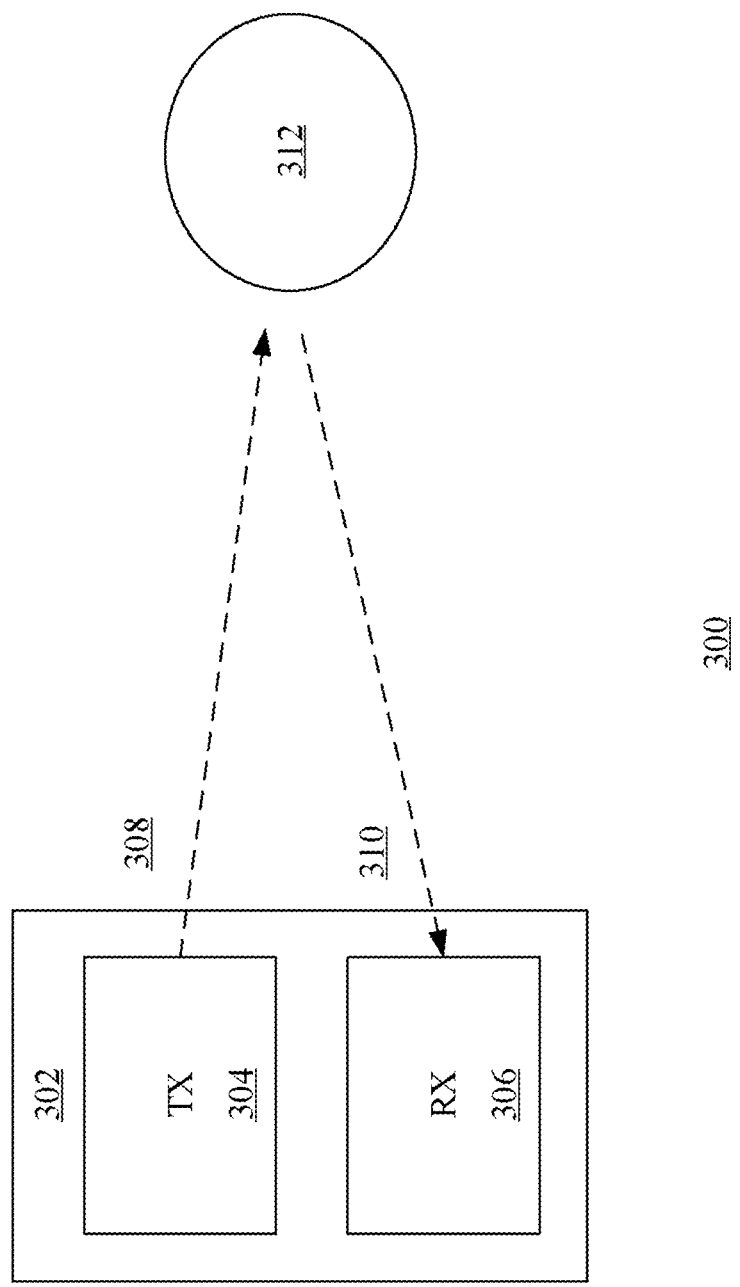

LIGHT EMISSION APPARATUS

CROSS REFERENCE TO RELATED APPLICATIONS

This patent application claims the benefit of U.S. Provisional Patent Application No. 62/916,243, filed Oct. 17, 2019, which is incorporated by reference in its entirety herein.

BACKGROUND

Optical technologies have been widely used in many applications, such as cell phone, digital still camera and vehicle Light Detection and Ranging (LiDAR). In a time of flight (ToF) system, a light emission apparatus is equipped for emitting the light toward a targeted object and a light receiving apparatus is equipped for receiving the light reflected from the targeted object to obtain the depth information.

In the development of the light emission apparatus, the driving circuit configured to drive the laser diode typically uses a serial structure, which means the switching element and the laser diode are coupled in series. These kind of circuit configurations are not suitable for high speed application and also consume relatively high power, the quality of the optical pulse could be poor and may cause the receiving problems at the light receiving apparatus.

SUMMARY

According to an embodiment of the present disclosure, a light emission apparatus is provided. The light emission apparatus includes a transistor comprising a control terminal, a first channel terminal, and a second channel terminal, wherein the control terminal is configured to receive a modulation signal, the first channel terminal is configured to generate a driving signal according to the modulation signal, and the second channel terminal is coupled to a fixed voltage; and a load comprising: a first terminal; a second terminal, wherein the first terminal is coupled to the first channel terminal of the transistor and the second terminal is coupled to the fixed voltage; a laser diode configured to emit a light according to the driving signal; and a first capacitor coupled to the laser diode, configured to isolate a DC current on the first terminal of the transistor.

According to an embodiment of the present disclosure, a light emission method is provided. The light emission method includes receiving, by a transistor, a modulation signal and generating a driving signal to a first terminal of a load according to the modulation signal; charging the first terminal of the load by an external voltage when the transistor is turned off; and discharging the first terminal of the load by the transistor when the transistor is turned on; wherein the load comprises a first capacitor coupled in series with the laser diode.

These and other objectives of the present disclosure will become obvious to those of ordinary skill in the art after reading the following detailed description of the alternative embodiments that are illustrated in the various figures and drawings.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIGS. 2A-2C illustrate circuit diagrams of a light emission apparatus, according to some embodiments.

FIG. 3 illustrates a system for sensing an object in an environment, according to some embodiments.

DETAILED DESCRIPTION

Figure 1A:
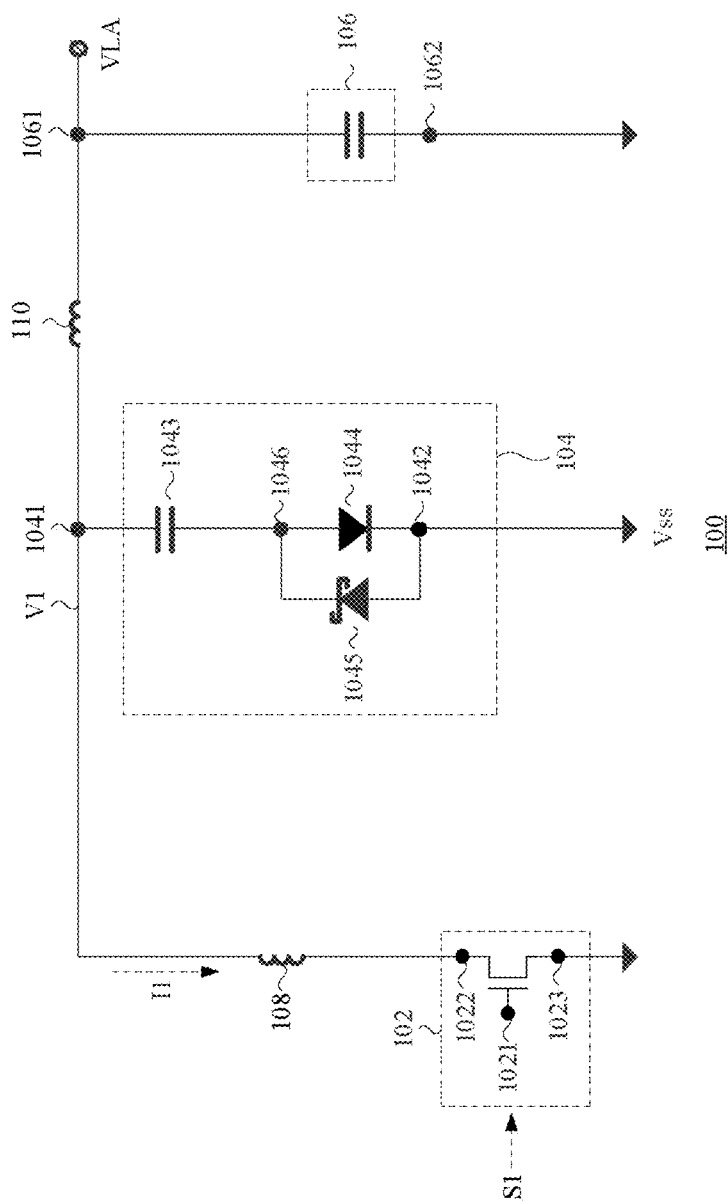
FIGS. 1A-1C illustrate circuit diagrams of a light emission apparatus, according to some embodiments.

FIG. 1A illustrates a circuit diagram of a light emission apparatus 100, according to some embodiments. The light emission apparatus 100 includes a transistor 102, a load 104, a capacitor 106, an inductor 108 and an inductor 110. The transistor 102 includes a control terminal 1021, a channel terminal 1022 and a channel terminal 1023, where the control terminal 1021 is configured to receive a modulation signal S1, the channel terminal 1022 is coupled to a terminal 1041 of the load 104 and the channel terminal 1023 is coupled to a fixed voltage Vss (e.g., ground voltage). The load 104 includes two terminals, where a terminal 1041 is coupled to the channel terminal 1022 of the transistor 102 and a terminal 1042 is coupled to the fixed voltage Vss (e.g., ground voltage). The capacitor 106 includes two terminals, where a terminal 1061 is coupled to the terminal 1041 and a terminal 1062 is coupled to the fixed voltage Vss (e.g., ground voltage). The inductor 108 is coupled between the channel terminal 1022 and the terminal 1041. The inductor 110 is coupled between the terminal 1041 and the terminal 1061.

In some embodiments, the transistor 102 can be a power transistor having a higher voltage and current tolerance, compared with a general or a low power transistor. The transistor 102 is configured to generate a driving signal including a driving current I1 and a driving voltage V1 to the load 104 according to the modulation signal S1, where the modulation signal S1 can a clock signal or a continuous pulse signal.

In some embodiments, the load 104 includes a capacitor 1043, a laser diode 1044 and a Schottky diode 1045. The capacitor 1043 is coupled between the terminal 1041 and the terminal 1046. The laser diode 1044 is coupled between the terminal 1046 and the terminal 1042, and configured to emit a light. The Schottky diode 1045 is also coupled between the terminal 1046 and the terminal 1042, which is coupled with the laser diode 1044 in parallel.

In some embodiments, the capacitor 106 is configured to stabilize an external supply voltage VLA, which protects from spikes or dips that occurred at a power line.

In some embodiments, the inductor 108 and the inductor 110 can be parasitic inductors formed on printed-circuit board (PCB), and configured to store energy.

During operation, the modulation signal S1 may turn off or turn on the transistor 102, the light emission apparatus 100 will operate at charging state when the transistor 102 is turned off, and the light emission apparatus 100 will operate at discharging state when the transistor 102 is turned on.

Figure 1B:
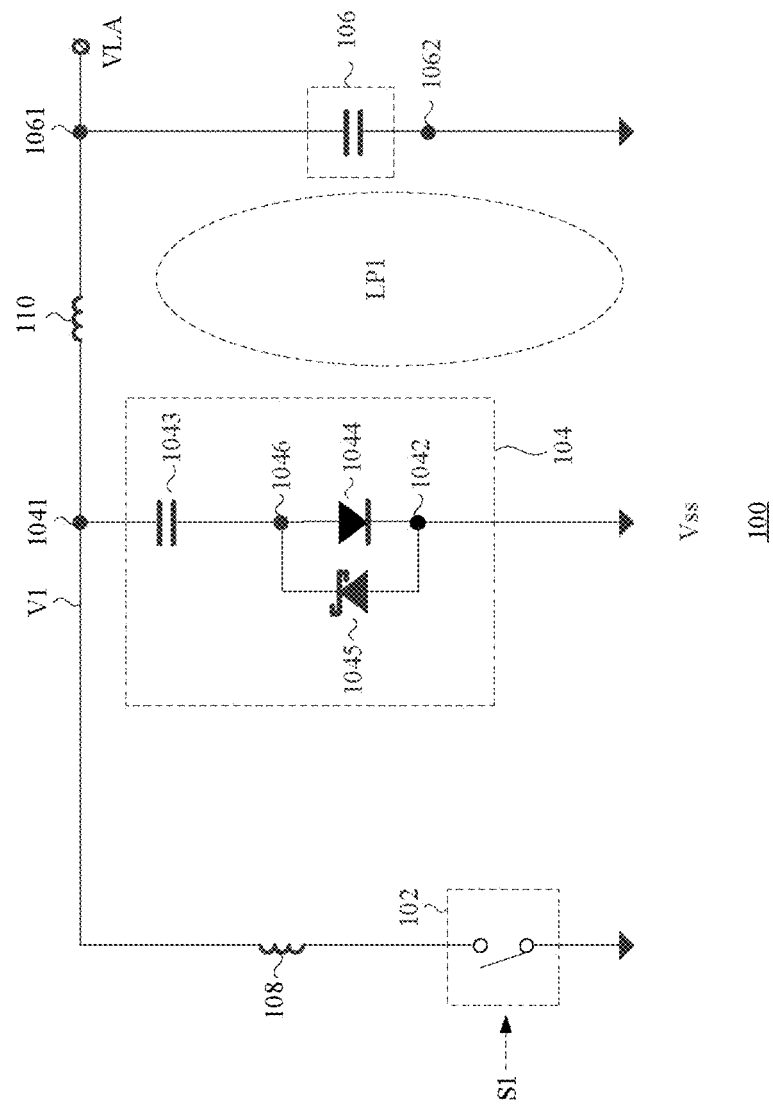

FIG. 1B illustrates an operational diagram of the light emission apparatus 100 under charging state. As illustrated in FIG. 1B, when the transistor 102 is turned off, the terminal 1041 of the load 104 will be charged by the external supply voltage VLA such that the driving voltage V1 will raise to the external supply voltage VLA. During the charging state, the energy will be stored in the loop LP1.

Figure 1C:
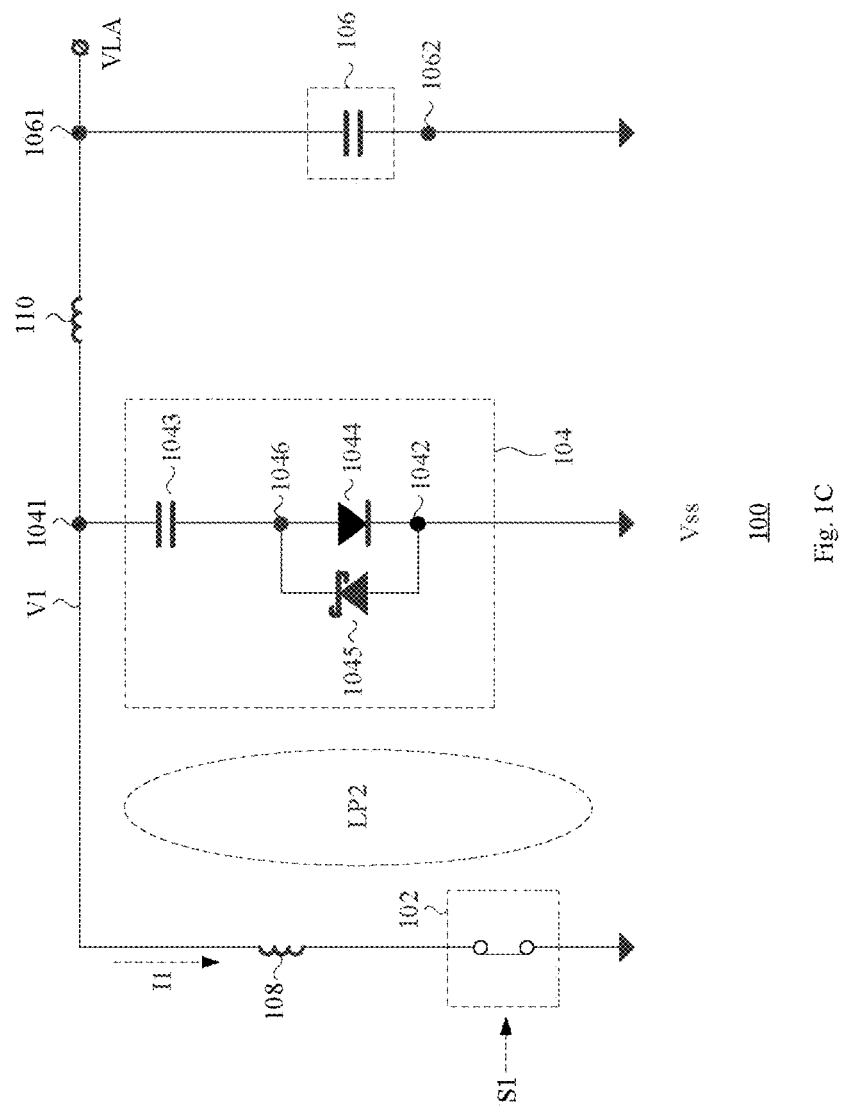

FIG. 1C illustrates an operational diagram of the light emission apparatus 100 under discharging state. As illustrated in FIG. 1C, when the transistor 102 is turned on, the driving current I1 flows to the fixed voltage Vss through inductor 108 and transistor 102, the terminal 1041 of the load 104 will be discharged by the transistor 102 such that the driving voltage V1 will drop to the fixed voltage Vss. During the discharging state, the energy stored in the loop LP1 will be discharged by the loop LP2.

Based on the operations illustrated in FIG. 1B and FIG. 1C, it is understood that these operations periodically short the external supply voltage VLA to the fixed voltage Vss through inductors 108 and 110 and transistor 102 such that the waveform of the driving voltage V1 can be generated and correspond to the modulation signal S1.

Furthermore, the capacitor 1043 is coupled between the terminal 1041 and the laser diode 1044 such that the capacitor 1043 and the laser diode 1044 are coupled in series and forms an AC-coupled configuration. With this configuration, the average DC current of the driving current I1 at terminal 1041 can be isolated by the capacitor 1043, the loading of the load 104 will not significantly reduce the performance of the light emission apparatus 100. To have a better operation of the laser diode 1044, the Schottky diode 1045 is added in anti-parallel connection with the laser diode 1044, such that the average voltage across the diode laser 1044 can be positive. Notably, the Schottky diode 1045 is an embodiment to restore the average DC level of the voltage across the laser diode 1044, other devices that may achieve the same or similar functions can be used as well.

As the degradation of the high frequency components is relatively small when using AC-coupled configuration to drive the laser diode 1044, the light emission apparatus 100 will have better performance for high speed application. For example, the light emission apparatus 100 may be applied in an application that the frequency of the modulation signal S1 is higher than 100 MHz.

FIG. 2A illustrates a circuit diagram of a light emission apparatus 200, according to some embodiments. The light emission apparatus 200 includes a transistor 102, a load 204, a capacitor 106, an inductor 108 and an inductor 110. The transistor 102 includes a control terminal 1021, a channel terminal 1022 and a channel terminal 1023, where the control terminal 1021 is configured to receive a modulation signal S1, the channel terminal 1022 is coupled to a terminal 1041 of the load 204 and the channel terminal 1023 is coupled to a fixed voltage Vss (e.g., ground voltage). The load 204 includes two terminals, where a terminal 1041 is coupled to the channel terminal 1022 of the transistor 102 and a terminal 1042 is coupled to the fixed voltage Vss (e.g., ground voltage). The capacitor 106 includes two terminals, where a terminal 1061 is coupled to the terminal 1041 and a terminal 1062 is coupled to the fixed voltage Vss (e.g., ground voltage). The inductor 108 is coupled between the channel terminal 1022 and the terminal 1041. The inductor 110 is coupled between the terminal 1041 and the terminal 1061.

Compare to the light emission apparatus 100, in this embodiment, the difference is in the configuration of the load 204. The light emission apparatus 200 includes the load 204 having a capacitor 1043, a laser diode 1044 and a Schottky diode 1045. The capacitor 1043 is coupled between the terminal 1042 and the terminal 1046. The laser diode 1044 is coupled between the terminal 1046 and the terminal 1041, and configured to emit a light. The Schottky diode 1045 is also coupled between the terminal 1046 and the terminal 1041, which is coupled with the laser diode 1044 in parallel.

In some embodiments, the transistor 102 of the light emission apparatus 200 can be a power transistor having a higher voltage and current tolerance, compared with a general or a low power transistor. The transistor 102 is configured to generate a driving signal including a driving current I1 and a driving voltage V1 to the load 204 according to the modulation signal S1, where the modulation signal S1 can a clock signal or a continuous pulse signal.

In some embodiments, the capacitor 106 is configured to stabilize an external supply voltage VLA, which protects from spikes or dips that occurred at a power line.

In some embodiments, the inductor 108 and the inductor 110 can be parasitic inductors formed on printed-circuit board (PCB), and configured to store energy.

During operation, the modulation signal S1 may turn off or turn on the transistor 102, the light emission apparatus 200 will operate at charging state when the transistor 102 is turned off, and the light emission apparatus 200 will operate at discharging state when the transistor 200 is turned on.

Figure 2B:
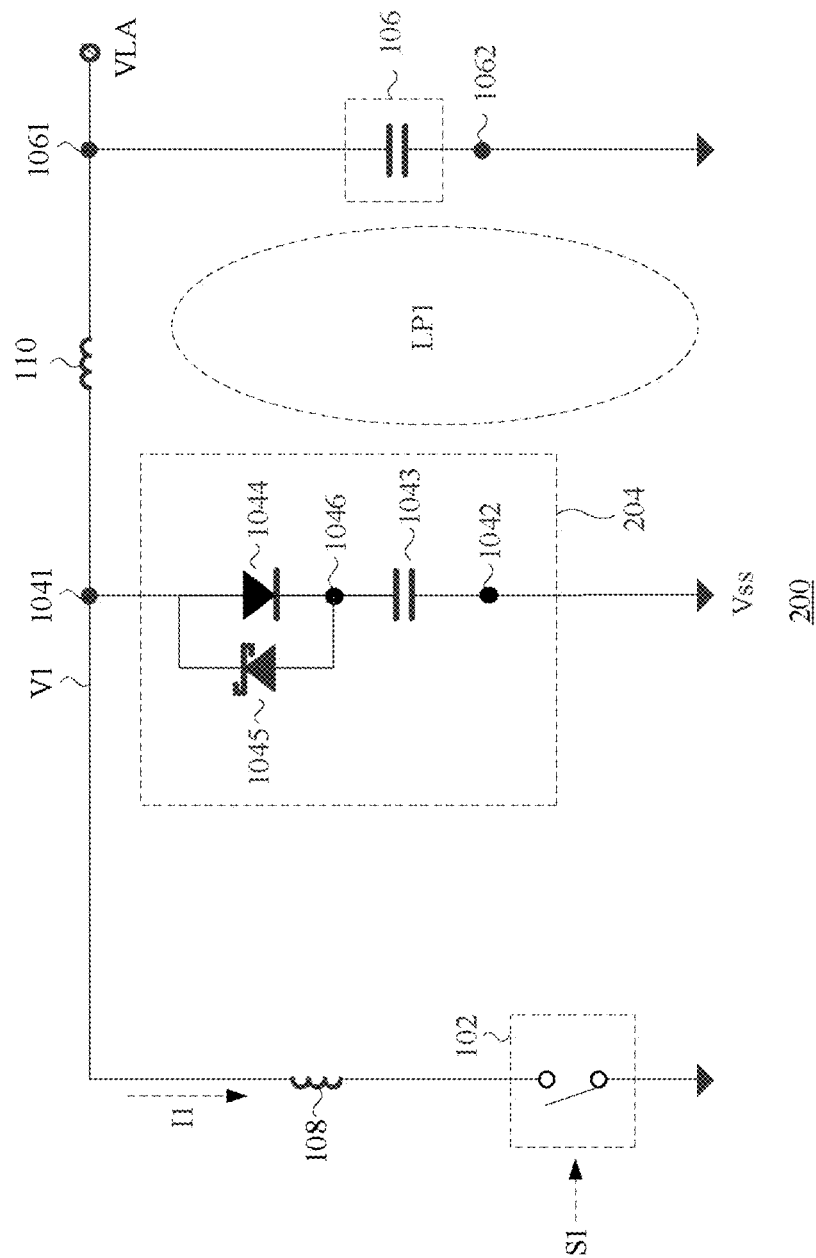

FIG. 2B illustrates an operational diagram of the light emission apparatus 200 under charging state. As illustrated in FIG. 2B, when the transistor 102 is turned off, the terminal 1041 of the load 204 will be charged by the external supply voltage VLA such that the driving voltage V1 will raise to the external supply voltage VLA. During the charging state, the energy will be stored in the loop LP1.

Figure 2C:
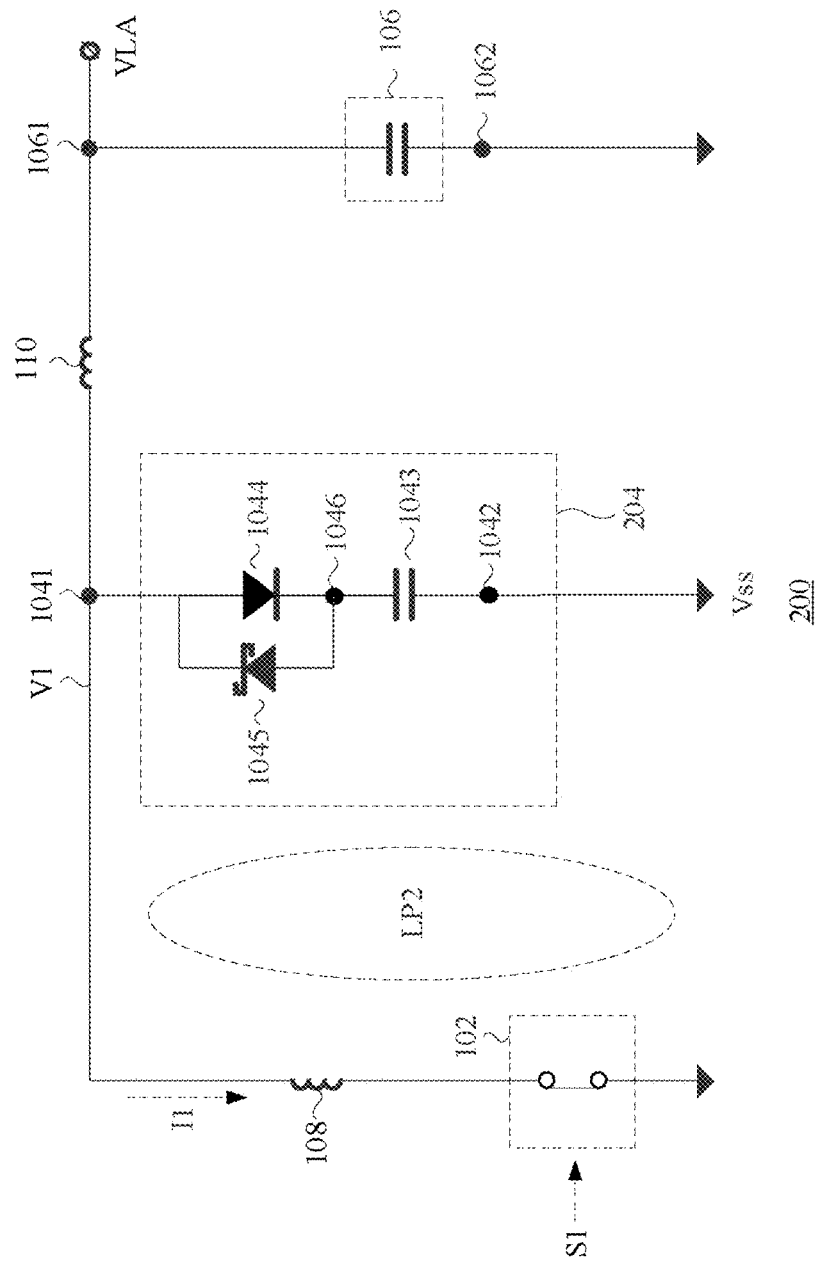

FIG. 2C illustrates an operational diagram of the light emission apparatus 200 under discharging state. As illustrated in FIG. 2C, when the transistor 102 is turned on, the driving current I1 flows to the fixed voltage Vss through inductor 108 and transistor 102, the terminal 1041 of the load 204 will be discharged by the transistor 102 such that the driving voltage V1 will drop to the fixed voltage Vss. During the discharging state, the energy stored in the loop LP1 will be discharged by the loop LP2.

Based on the operations illustrated in FIG. 2B and FIG. 2C, it is understood that these operations periodically short the external supply voltage VLA to the fixed voltage Vss through inductors 108 and 110 and transistor 102 such that the waveform of the driving voltage V1 can be generated and correspond to the modulation signal S1.

Furthermore, the capacitor 1043 is coupled between the terminal 1041 and the laser diode 1044 such that the capacitor 1043 and the laser diode are coupled in series and forms an AC-coupled configuration. With this configuration, the average DC current of the driving current I1 at terminal 1041 can be isolated by the capacitor 1043, the loading of the load 104 will not significantly reduce the performance of the light emission apparatus 100. To have a better operation of the laser diode 1044, the Schottky diode 1045 is added in anti-parallel connection with the laser diode 1044, such that the average voltage across the diode laser 1044 can be positive. Notably, the Schottky diode 1045 is an embodiment to restore the average DC level of the voltage across the laser diode 1044, other devices that may achieve the same or similar functions can be used as well.

As the degradation of the high frequency components is relatively small when using AC-coupled configuration to drive the laser diode 1044, the light emission apparatus 200 will have better performance for high speed applications. For example, the light emission apparatus 200 may be applied in an application where the frequency of the modulation signal S1 is higher than 100 MHz.

The present disclosure provides a light emission apparatus having the following features. First, the driving voltage V1 generated by the transistor 102 is a modulation signal, where similar to a clock signal, the driving voltage V1 goes up and down. During operation, the transistor 102 periodically shorts the external supply VLA to the fixed voltage Vss (e.g., ground) through inductors 108 and 110. From the structure prospect, the transistor 102, the external supply VLA, and the load 104/204 are coupled in parallel.

Second, the load 104/204 is AC-coupled to output of the transistor 102 and isolates DC current on the terminal 1041. The driving current I1 is generated depends on the voltage of the driving voltage V1 and its frequency, since impedances of parasitic inductors 108 and 110 in series with the load 104/204 increase with frequency. The increased impedance results in lower overall current during both charge and discharge phases of periodic pulse operation. If frequency increases, the supply voltage must increase to maintain desired current. AC-coupling allows the parallel-connected external supply voltage VLA to exceed the laser threshold without any current flow in the absence of clock pulses. This allows simple control of both pulse amplitude and duration without any safety/shutdown circuitry.

Third, the laser diode 1044 is connected directly in parallel with a reversed Schottky diode 1045. Its purpose is DC restoration and makes possible to apply long bursts of pulses to the load 104/204. This reversed parallel connection works to partially compensate distortion of the burst envelope.

Fourth, using parasitic inductor 108 and inductor 110 as it main storage inductance can save the usage of inductors.

FIG. 3 illustrates an example of a system 300 for sensing an object 312 in an environment. The system 300 includes a device 302 and an object 312. The device 302 may be a mobile device (e.g., a smartphone, a tablet, etc.), a vehicle, and/or any other devices that are implemented to have functions for sensing objects. The device 302 includes a transmitter 304 and a receiver 306. In connection with the embodiments illustrated in the present disclosure, the light emission apparatus 100 and the light emission apparatus 200 can be implemented in the transmitter 304. The transmitter 304 is configured to transmit a light 308 generated by the laser diode 1044. In some embodiments, the light 308 may be a pulsed signal. In some other embodiments, the light 308 may be a periodic signal (e.g., a sine wave, a square wave, etc.) having one or more operating frequencies. The light 308 reflects from a surface of the object 312, and the reflected light 310 is received by the receiver 306. The receiver 306 may include one or more photodetectors for detecting the reflected light 310 and determine the distance between the device 302 and the object 312.

While the present disclosure has been described by way of example and in terms of a preferred embodiment, it is to be understood that the present disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emission apparatus, comprising:
a transistor comprising a control terminal, a first channel terminal, and a second channel terminal, wherein the control terminal is configured to receive a modulation signal, the first channel terminal is configured to generate a driving signal according to the modulation signal, and the second channel terminal is coupled to a fixed voltage; and
a load comprising:
a first terminal;
a second terminal, wherein the first terminal is coupled to the first channel terminal of the transistor and the second terminal is coupled to the fixed voltage;
a laser diode configured to emit a light according to the driving signal; and
a first capacitor coupled to the laser diode, configured to isolate a DC current on the first terminal of the load.

2. The light emission apparatus of claim 1, wherein the laser diode and the first capacitor are coupled in series.

3. The light emission apparatus of claim 1, wherein the first capacitor is coupled between the first terminal of the load and the laser diode.

4. The light emission apparatus of claim 1, wherein the first capacitor is coupled between the fixed voltage and the laser diode.

5. The light emission apparatus of claim 1, further comprising:
a Schottky diode, coupled with the laser diode in parallel, configured to establish a DC signal on the laser diode.

6. The light emission apparatus of claim 1, further comprising:
a first inductor coupled between the first channel terminal of the transistor and the first terminal of the load.

7. The light emission apparatus of claim 6, further comprising:
a second inductor coupled between the first terminal of the load and an external supply voltage.

8. The light emission apparatus of claim 7, wherein the first inductor and the second inductor are parasitic inductors.

9. The light emission apparatus of claim 7, further comprising:
a second capacitor coupled between the external supply voltage and the fixed voltage.

10. The light emission apparatus of claim 1, wherein the frequency of the modulation signal is higher than 100 MHz.

11. A method for controlling a laser diode, comprising:
receiving, by a transistor, a modulation signal and generating a driving signal to a first terminal of a load according to the modulation signal;
charging the first terminal of the load by an external voltage when the transistor is turned off; and
discharging the first terminal of the load by the transistor when the transistor is turned on;
wherein the load comprises a first capacitor coupled in series with the laser diode.

12. The method of claim 11, wherein a DC current on the first terminal of the transistor is isolated by the first capacitor.

13. The method of claim 11, wherein the first capacitor is coupled between the first terminal of the load and the laser diode.

14. The method of claim 11, wherein the first capacitor is coupled between a fixed voltage and the laser diode.

15. The method of claim 11, further comprising:
   establishing, by a Schottky diode, a DC signal on the laser diode.

16. The method of claim 11, further comprising:
   stabilizing, by a second capacitor, the external voltage.

17. The method of claim 11, wherein a light generated by the laser diode is a pulsed signal or periodic signal.

18. The method of claim 11, wherein a frequency of the modulation signal is higher than 100 MHz.

\* \* \* \* \*